(12) United States Patent
Otsubo et al.

(10) Patent No.: US 11,264,233 B2
(45) Date of Patent: Mar. 1, 2022

(54) METHOD FOR CLEANING SUBSTRATE AND SUBSTRATE PROCESSING APPARATUS

(71) Applicant: KIOXIA CORPORATION, Tokyo (JP)

(72) Inventors: Kyo Otsubo, Shinagawa Tokyo (JP); Hideaki Sakurai, Kawasaki Kanagawa (JP); Minako Inukai, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/876,291

(22) Filed: May 18, 2020

(65) Prior Publication Data
US 2020/0279731 A1    Sep. 3, 2020

Related U.S. Application Data

(63) Continuation of application No. 15/448,551, filed on Mar. 2, 2017, now Pat. No. 10,692,715.

(30) Foreign Application Priority Data

Aug. 9, 2016    (JP) .................................. 2016-156720

(51) Int. Cl.
*H01L 21/02*    (2006.01)
*B08B 3/04*    (2006.01)
(Continued)

(52) U.S. Cl.
CPC ........ *H01L 21/02101* (2013.01); *B08B 3/041* (2013.01); *B08B 3/08* (2013.01);
(Continued)

(58) Field of Classification Search
CPC ......... H01L 21/67051; H01L 21/67028; H01L 21/67207
See application file for complete search history.

(56) References Cited

U.S. PATENT DOCUMENTS 4,962,776 A    10/1990  Liu et al.
7,410,545 B2    8/2008  Matsubara
(Continued)

FOREIGN PATENT DOCUMENTS

JP    H05144789 A    6/1993
JP    2001068447 A    3/2001
(Continued)

OTHER PUBLICATIONS

Japanese Office Action dated Jun. 7, 2019, mailed in counterpart Japanese Application No. 2016-156720, 6 pages (with translation).

*Primary Examiner* — Natasha N Campbell
(74) *Attorney, Agent, or Firm* — Kim & Stewart LLP

(57) ABSTRACT

According to one embodiment, a method for cleaning a substrate includes first cleaning process and second cleaning process. The first cleaning process subjects a substrate to a first cleaning method. The second cleaning process subjects the substrate to a second cleaning method that is different from the first cleaning method and is subsequent to the first cleaning process. The first cleaning method includes at least one of acidic cleaning or alkaline cleaning. The second cleaning method includes freeze cleaning.

12 Claims, 13 Drawing Sheets

(51) Int. Cl.
    *B08B 3/08*         (2006.01)
    *B08B 7/00*         (2006.01)
    *B08B 7/04*         (2006.01)
    *H01L 21/67*        (2006.01)
    *G03F 7/00*         (2006.01)

(52) U.S. Cl.
    CPC .......... *B08B 7/0014* (2013.01); *B08B 7/0092* (2013.01); *B08B 7/04* (2013.01); *G03F 7/0002* (2013.01); *H01L 21/67051* (2013.01)

(56) References Cited

U.S. PATENT DOCUMENTS

| | | |
|---|---|---|
| 2002/0026952 A1* | 3/2002 | Fujino .............. H01L 21/02052 134/1.3 |
| 2003/0098040 A1 | 5/2003 | Nam et al. |
| 2006/0266382 A1 | 11/2006 | Matsubara |
| 2007/0221254 A1 | 9/2007 | Izumi et al. |
| 2007/0235062 A1 | 10/2007 | Fujiwara et al. |
| 2010/0313907 A1 | 12/2010 | Sinha et al. |

FOREIGN PATENT DOCUMENTS

| | | |
|---|---|---|
| JP | 2001274135 A | 10/2001 |
| JP | 2006332396 A | 12/2006 |
| JP | 2007258512 A | 10/2007 |
| JP | 4767138 B2 | 9/2011 |
| JP | 2015177124 A | 10/2015 |

* cited by examiner

FORMING
LIQUID FILM

MELTING +
RINSING

SOLIDIFYING

DRYING

FIG. 15
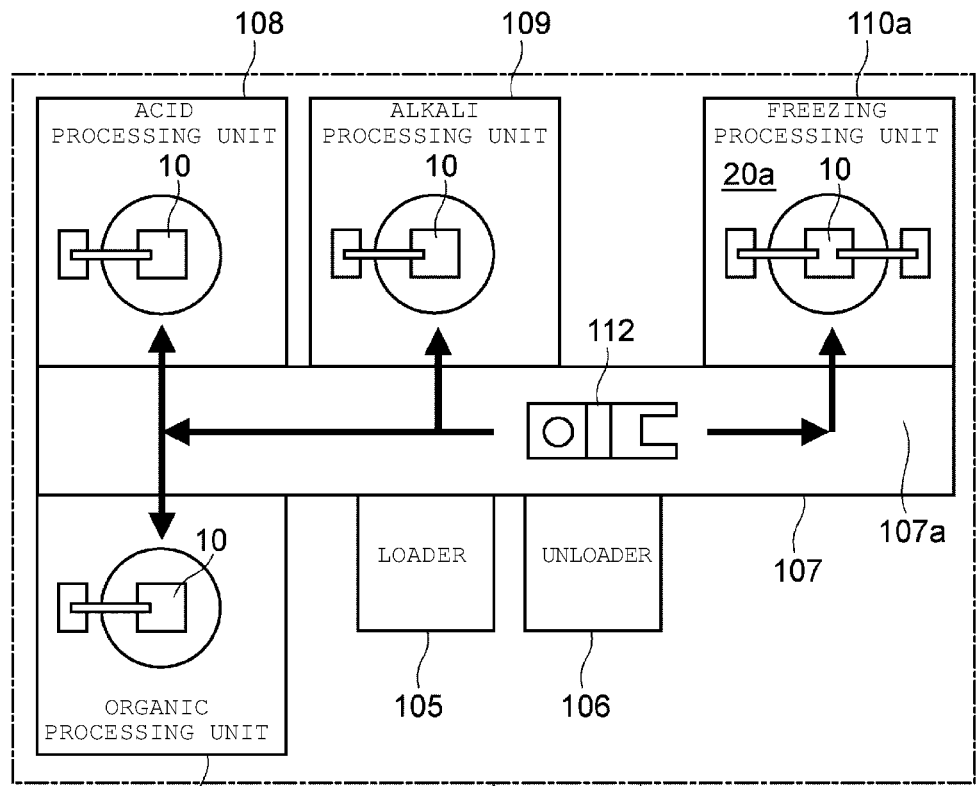
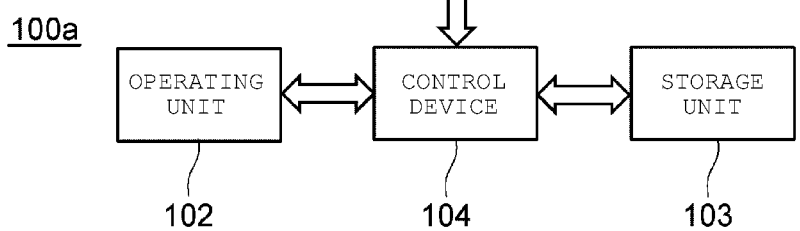
FIG. 16
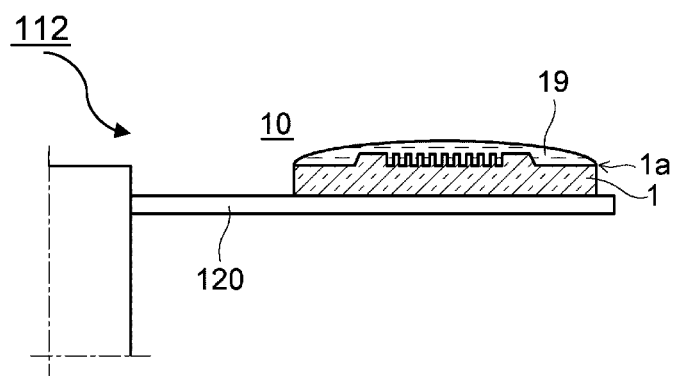

METHOD FOR CLEANING SUBSTRATE AND SUBSTRATE PROCESSING APPARATUS

CROSS-REFERENCE TO RELATED APPLICATIONS

This application is a continuation of U.S. patent application Ser. No. 15/448,551, filed Mar. 2, 2017, now U.S. Pat. No. 10,692,715, granted on Jun. 23, 2020, which is based upon and claims the benefit of priority from Japanese Patent Application No. 2016-156720, filed Aug. 9, 2016, the entire contents of each of which are incorporated herein by reference.

FIELD

Embodiments described herein relate generally to a method for cleaning a substrate and a substrate processing apparatus.

BACKGROUND

Miniaturization of a semiconductor device is constantly progressing. Imprint lithography is a lithography technique for miniaturizing a semiconductor device. In imprint lithography, an imprint lithography template (hereinafter, referred to as a template) is used to replicate an original pattern. The template is a substrate, for example, a glass substrate with a patterned surface. The template is placed into contact with a resist layer formed on a semiconductor wafer or the like. The original pattern is formed by the patterned surface of the template, and this original pattern is transferred to the resist layer by the template. Since the template is used to replicate its patterned surface, the patterned surface is required to be maintained at a high degree of cleanliness with very little foreign matter, such as particles being permitted thereon.

DESCRIPTION OF THE DRAWINGS

FIG. 15 is a schematic block diagram illustrating a first example of a production system of the substrate.

FIG. 16 is a schematic cross-sectional view illustrating an example of a transporting state of the template.

DETAILED DESCRIPTION

Figure 1:
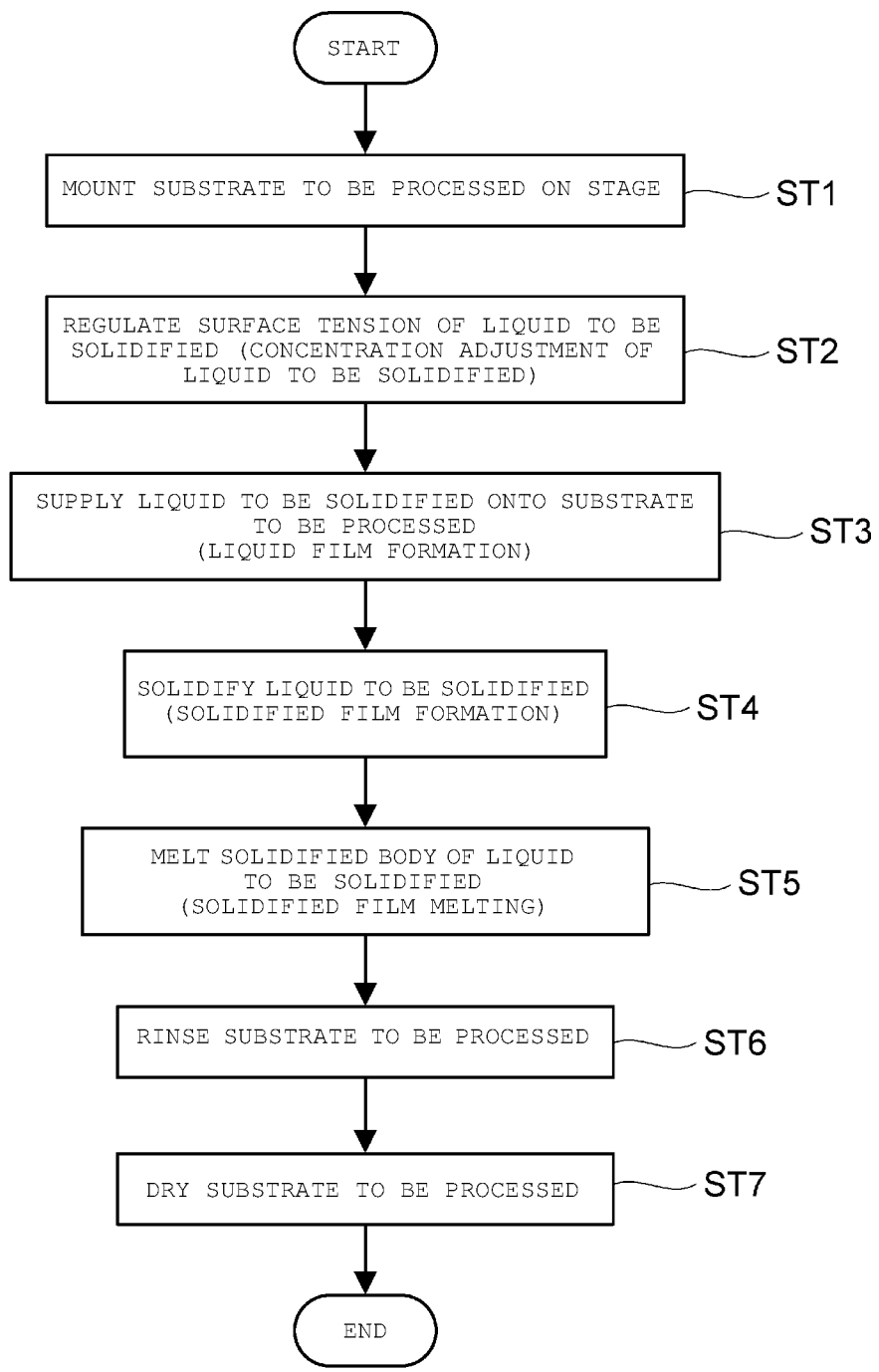
FIG. 1 is a flowchart illustrating an example of a method for cleaning a substrate according to a first embodiment.

Embodiments provide a method for cleaning a substrate that is capable of obtaining a substrate with a high degree of cleanliness of a patterned surface and a substrate processing apparatus.

In general, according to one embodiment, a method for cleaning a substrate includes a first cleaning process and a second cleaning process. The first cleaning process subjects a substrate to a first cleaning method. The second cleaning process subjects the substrate to a second cleaning method that is different from the first cleaning method and is subsequent to the first cleaning process. The first cleaning method includes at least one of acidic cleaning or alkaline cleaning. The second cleaning method includes freeze cleaning.

Hereinafter, embodiments will be described with reference to drawings. In the drawings, the same elements are indicated by the same reference numerals. In the embodiments, cleaning of templates used in imprint lithography, for example, nanoimprint lithography will be exemplified.

First Embodiment

Cleaning Method

Figure 2:
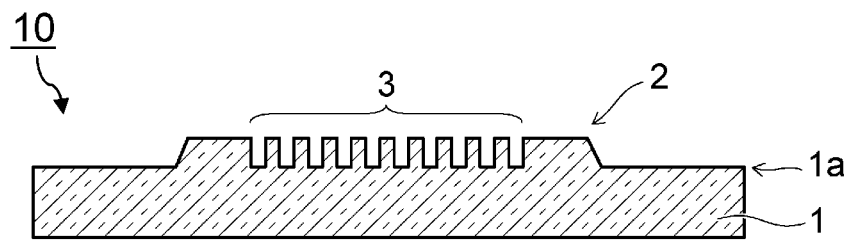
FIG. 2 is a schematic cross-sectional view illustrating an example of a template.

FIG. 1 is a flowchart illustrating an example of a method for cleaning a substrate according to a first embodiment. FIG. 2 is a schematic cross-sectional view illustrating an example of a template. FIGS. 3A to 3D are schematic cross-sectional views illustrating an example of the method for cleaning a substrate according to the first embodiment.

0. Processing of a Substrate

A substrate to be processed is provided to a processing chamber of a cleaning device. As illustrated in FIG. 2, an example of the substrate to be processed is, for example, a template 10 to be used for nanoimprint lithography.

The template 10 includes, for example, a quartz substrate 1. A convex shaped mesa 2 (consisting of a plurality of protrusions and depressions) is provided on a patterned surface 1a of the quartz substrate 1. A patterned region 3 is provided in the mesa 2. The template 10 is an "original pattern" of a lithography process in a manufacturing process of a semiconductor device. In the lithography process, the patterned region 3 of the template 10 is pressed against, for example, a resist layer on a semiconductor wafer. Therefore, a pattern corresponding to the pattern provided on the patterned region 3 is transferred to the resist layer, for example. The pattern provided on the patterned region 3 corresponds to a wiring pattern or an open hole pattern of the semiconductor device. In the embodiment, for example, a line and space (L/S) pattern is formed as a pattern on the patterned region 3.

An example of the L/S pattern is a pattern with a half pitch of about 20 nm and a dig depth of about 40 nm. For example, about 20 small particles having a size of about 15 nm or less are present on such a patterned surface 1a of the template 10. It is difficult to remove the small particles only by cleaning with an alkaline cleaning liquid and an acidic cleaning liquid. In the embodiment, the following cleaning methods are performed subsequent to cleaning using the alkaline cleaning liquid and the acidic cleaning liquid, for example.

1. Mounting of Substrate to be Processed on Stage

As illustrated in Step ST1 in FIG. 1, the template (substrate to be processed) 10 is mounted on a stage (not illustrated) provided in a chamber of the cleaning device.

2. Regulation of Surface Tension of Liquid to be Solidified

As illustrated in Step ST2 in FIG. 1, surface tension of a liquid to be solidified is regulated. An example of the liquid to be solidified is deionized water (DIW). The DIW is a solvent. A regulator fluid is blended with the DIW. The regulator fluid regulates the surface tension of the liquid to be solidified. Examples of the regulator fluid include at least one of a surfactant and an alcohol. In the embodiment, the alcohol is used as the regulator fluid. An example of the alcohol is isopropyl alcohol (IPA). When the IPA is blended with the DIW, the surface tension of the DIW becomes lower than the surface tension before the blending. A temperature of the DIW is, for example, a normal temperature (room temperature).

The surface tension of the liquid to be solidified is regulated based on a concentration of the regulator fluid in the liquid to be solidified, for example. The surface tension, for example, decreases as the concentration of the regulator fluid in the liquid to be solidified increases. Alternatively, when the concentration of the regulator fluid in the liquid to be solidified exceeds a "critical concentration", the surface tension rapidly decreases. Whether the surface tension reaches a "set value" is determined, for example, by measuring the concentration of the regulator fluid in the liquid to be solidified and determining whether the concentration reaches the "set value". In the embodiment, it is determined whether the surface tension is reached the "set value" based on whether the concentration of the IPA in the DIW reaches the "set value".

For example, in the present embodiment, about 10 wt % of the IPA is blended with the DIW at a normal temperature. The concentration of the IPA is changed depending on the set surface tension. An example of a practical range is a finite value of 30 wt % or less.

The same is applied to a case where a surfactant is used as the regulator fluid. For example, the surface tension is regulated based on the concentration of the surfactant in the DIW. An example of the practical range of the concentration of the surfactant is the finite value of 30 wt % or less. As the surfactant applicable to the embodiment, a compound having a hydrophilic group and a hydrophobic group in one molecule can be exemplified.

In the embodiment, an example in which Step ST2 is executed after Step ST1 is described. However, the order of Step ST1 and Step ST2 may be reversed.

3. Supplying of Liquid to be Solidified

Figure 3A:
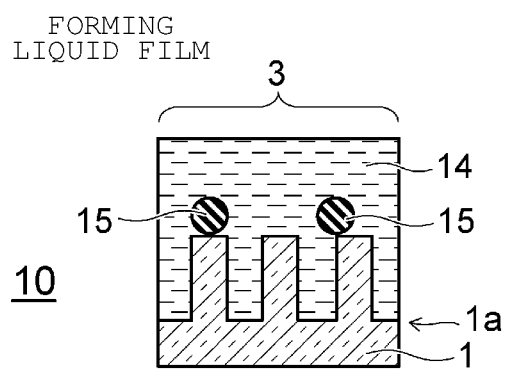
FIGS. 3A to 3D are schematic cross-sectional views illustrating an example of the method for cleaning a substrate according to the first embodiment.

After the surface tension of the liquid to be solidified is regulated, as illustrated in Step ST3 in FIG. 1 and FIG. 3A, the liquid to be solidified is supplied onto the template (substrate to be processed) 10. Therefore, for example, a liquid film 14 is formed on the patterned surface 1a of the template 10. The small particles, identified as reference numeral 15, are present on the patterned surface 1a. The size of the small particles 15 is, for example, about 15 nm or less.

Before Step ST3, the patterned surface 1a may be hydrophilized, for example. When hydrophilizing the patterned surface 1a, it becomes easier to form the liquid film 14 on the patterned surface 1a as compared with a case where there is no hydrophilizing of the patterned surface 1a. An example of a hydrophilization processing is a UV process of treating the patterned surface 1a with UV light.

Step ST3 may be performed in a state where the template (substrate to be processed) 10 is cooled. For example, the template 10 may be previously cooled. The liquid to be solidified is supplied onto the previously cooled template 10. By previously cooling the template 10 in this manner, it is possible to obtain an advantage where, for example, it is possible to shorten a time required for the next Step ST4.

4. Solidification of Liquid to be Solidified

Figure 3C:
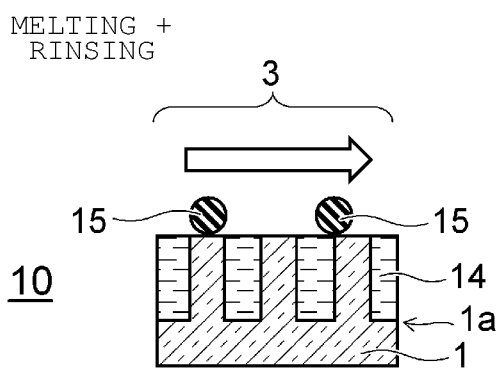
Figure 3B:
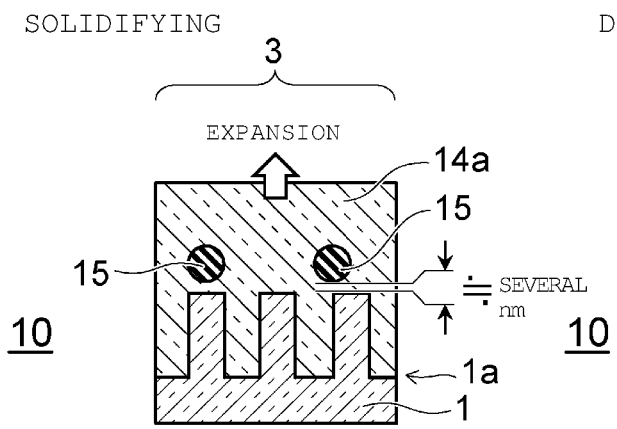

As illustrated in Step ST4 in FIG. 1 and FIG. 3B, the liquid to be solidified (liquid film 14) is solidified (frozen). Therefore, a solidified film 14a is formed on the patterned surface 1a on the template 10. In order to solidify the liquid film 14, a cooling gas is discharged onto, for example, the liquid film 14 or a back surface of the template 10 to cool the liquid film 14. An example of the cooling gas is a nitrogen ($N_2$) gas. An example of the temperature of $N_2$ gas is $-100°$ C. Cooling of the liquid film 14 may be a so-called "refrigerator system" such as maintaining the inside the chamber at a low temperature in addition to discharging of the cooling gas.

In a case where the liquid to be solidified is the DIW, for example, when the liquid film 14 is solidified, the liquid film 14 is expanded. The liquid film 14 becomes the solidified film 14a, and when the film is expanded in a volume, the small particles 15 rise up from the patterned surface 1a by, for example, about several nm.

5. Melting of Solidified Body

As illustrated in Step ST5 in FIG. 1, and FIG. 3C, a melting liquid is supplied to the solidified film 14a and the solidified film 14a is melted (thawed). An example of the melting liquid is DIW. The melting liquid may be any fluid. The fluid may be air. The fluid may be temperature-regulated. The fluid is not only supplied to the solidified film 14a but may also be in contact with the solidified film 14a. The solidified film 14a may be naturally thawed without using the melting liquid.

6. Rinsing of Substrate to be Processed

As illustrated in Step ST6 in FIG. 1, and FIG. 3C, a rinsing liquid is supplied to the template 10 and the template (substrate to be processed) 10 is rinsed. An example of the rinsing liquid is DIW. The small particles 15 and the melted solidified film 14a are removed from the patterned surface 1a of the template 10. Rinsing of the template 10 may be performed with the DIW or may be performed with an extremely low concentration alkaline aqueous liquid.

7. Drying of Substrate to be Processed

Figure 3D:
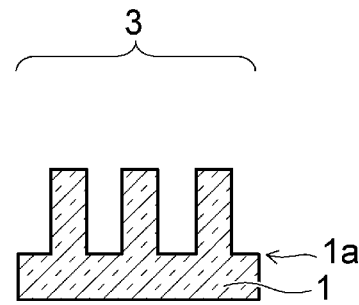

As illustrated in Step ST7 in FIG. 1, and FIG. 3D, the template (substrate to be processed) 10 is dried. After drying is ended, the template 10 is transported out of the processing chamber of the cleaning device. Therefore, an example of the method for cleaning a substrate according to the first embodiment is ended.

Comparison with Reference Example

Figure 4A:
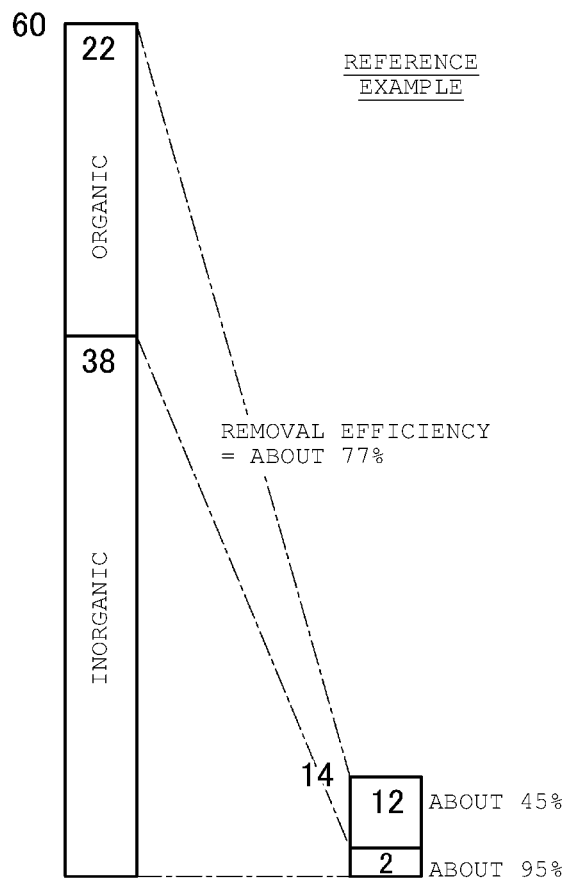
FIG. 4A is a diagram illustrating a result of freeze cleaning of a reference example.
Figure 4B:
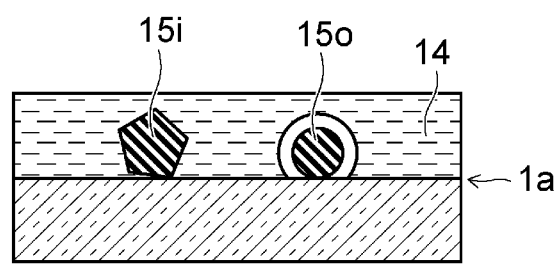
FIGS. 4B to 4D are schematic cross-sectional views illustrating a state where small particles are removed of the reference example.
Figure 4C:
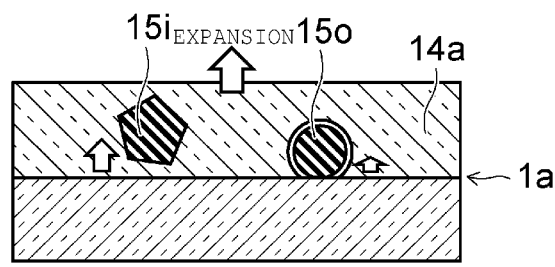
Figure 4D:
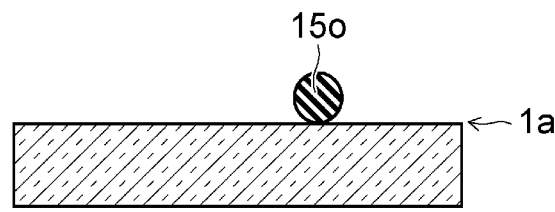
Figure 5A:
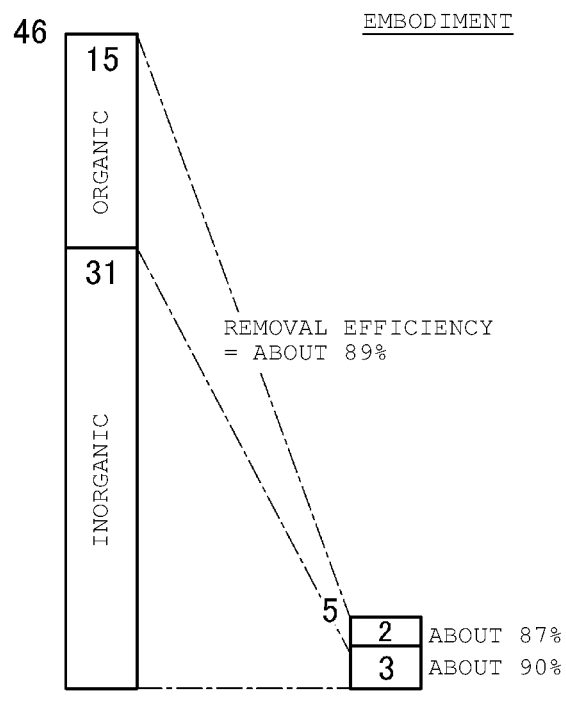
FIG. 5A is a diagram illustrating a result of freeze cleaning of the embodiment.

FIG. 4A is a diagram illustrating a result of freeze cleaning of a reference example, and FIGS. 4B to 4D are schematic cross-sectional views illustrating a state where the small particles are removed of the reference example. FIG. 5A is a diagram illustrating a result of freeze cleaning of the embodiment, and FIGS. 4B to 4D are schematic cross-sectional views illustrating a state where small particles are removed in the embodiment.

The reference example is a case where the DIW is solidified as the freeze cleaning. The regulator fluid such as the alcohol and the surfactant is not blended with the DIW of the reference example.

As illustrated in FIG. 4A, before the freeze cleaning, 60 small particles are present on the patterned surface 1a of the template 10. Among the small particles, there are 38 inorganic particles and 22 organic particles. The size of the small particles is about 15 nm or less.

After the freeze cleaning, the number of small particles is decreased to 14. Among the small particles, there are 2 inorganic particles and 12 organic particles. The removal efficiency of the inorganic particles of the reference example is about 95% and the removal efficiency of the organic particles is about 45%. In the reference example, a difference between the removal efficiency of the inorganic particles and the removal efficiency of the organic particles is great. The removal efficiency of the organic particles is less than 50%. Accordingly, the removal efficiencies of entire the small particles of the reference example are remained at about 77%.

The present embodiment is a case where the liquid to be solidified (liquid film 14), which is obtained by blending the IPA with the DIW, is solidified. In the embodiment, 10 wt % of the IPA is blended with the DIW.

As illustrated in FIG. 5A, before the freeze cleaning, 46 small particles are present on the patterned surface 1a of the template 10. Among the small particles, there are 31 inorganic particles and 15 organic particles.

After the freeze cleaning, the number of the small particles is decreased to 5. Among the small particles, there are 3 inorganic particles and 2 organic particles. The removal efficiency of the inorganic particles of the embodiment is about 90% and the removal efficiency of the organic particles is about 87%. According to the embodiment, it is possible to reduce the difference between the removal efficiency of the inorganic particles and the removal efficiency of the organic particles as compared with the reference example. In the embodiment, it is possible to increase the removal efficiency of the organic particles while ensuring about 90% of the removal efficiency of the inorganic particles. The removal efficiencies of entire the small particles of the embodiment are also improved from about 77% to about 89% of the reference example.

As for reasons why the removal efficiency of the organic particles of the embodiment is improved as compared with the reference example, for example, the following matters may be considered.

As illustrated in FIG. 4B, inorganic particles 15i (only one is shown) have relatively good hydrophilicity to the DIW. Accordingly, it is relatively easy for the DIW to permeate under the inorganic particles 15i. However, organic particles 15o (only one is shown) often have hydrophobicity to the DIW. Thus, it is more difficult for the DIW to permeate under the organic particles 15o.

Therefore, as illustrated in FIG. 4C, the liquid film 14 is changed to the solidified film 14a after cooling thereof, for example, even if the film is expanded in a volume, the organic particles 15o hardly moves away (rises up) from the patterned surface 1a. As a result, as illustrated in FIG. 4D, in the reference example, the organic particles 15o remain on the patterned surface 1a.

Figure 5B:
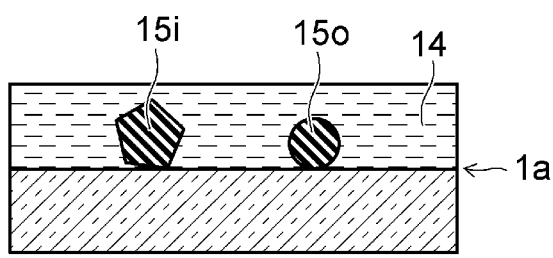
FIGS. 5B to 5D are schematic cross-sectional views illustrating a state where small particles are removed in the embodiment.

With respect to this, in the embodiment, the surface tension of the liquid to be solidified is regulated to be smaller than a surface tension, for example, the DIW that is a solvent. Therefore, as illustrated in FIG. 5B, the liquid to be solidified may blend with the surfaces of the organic particles 15o. Accordingly, as compared with the reference example, the liquid to be solidified easily flows not only under the inorganic particles 15i but also under the organic particles 15o.

Figure 5C:
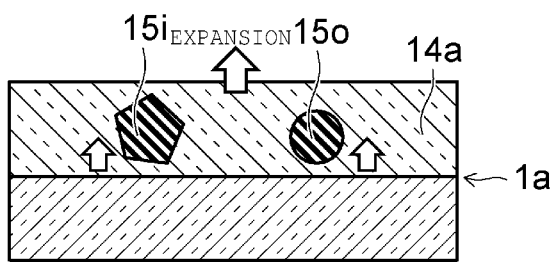
Figure 5D:
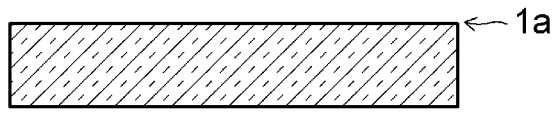

When the liquid film 14 is changed to the solidified film 14a and expanded, as illustrated in FIG. 5C, the organic particles 15o easily rises up from the patterned surface 1a as compared with the reference example. Therefore, according to the embodiment, as illustrated in FIG. 5D, the organic particles 15o are also easily removed from the above of the patterned surface 1a.

According to the method for cleaning a substrate according to the first embodiment, it is possible to provide the method for cleaning a substrate that is capable of obtaining a substrate with a high degree of cleanliness of the patterned surface.

Second Embodiment

A second embodiment is an example of a substrate processing apparatus that is capable of executing the method for cleaning a substrate according to the first embodiment. The substrate processing apparatus of the embodiment is, for example, a cleaning device.

Cleaning Device

Figure 6:
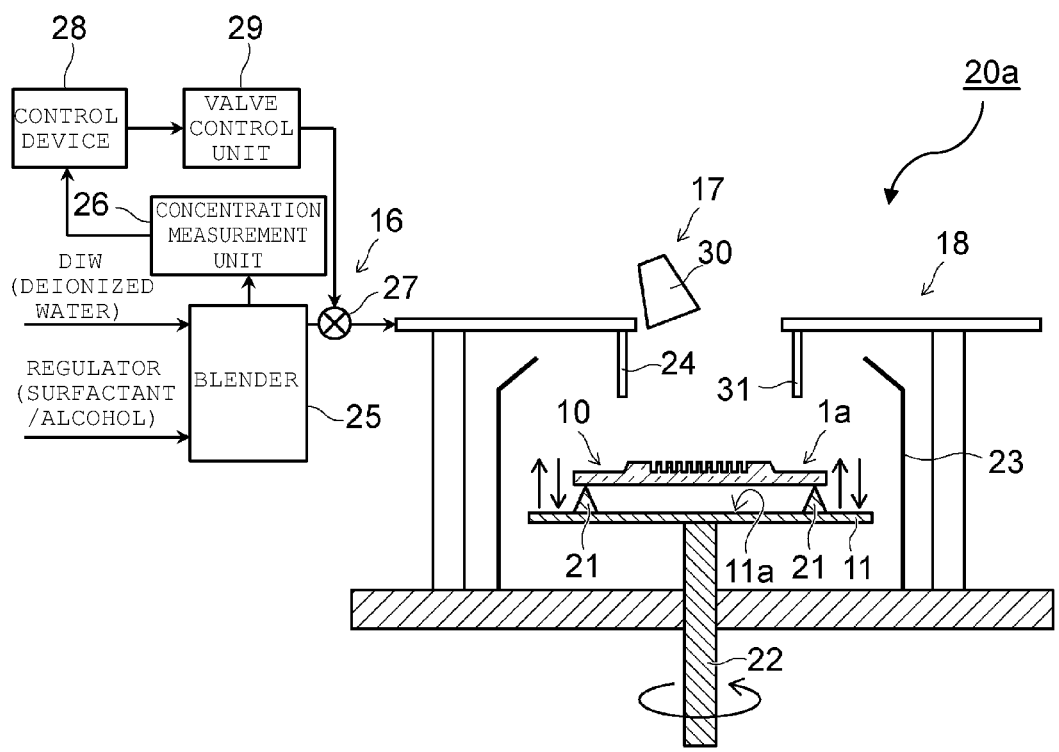
FIG. 6 is a schematic cross-sectional view schematically illustrating a cleaning device of a substrate according to a second embodiment.

FIG. 6 is a schematic cross-sectional view schematically illustrating a cleaning device of a substrate according to a second embodiment.

As illustrated in FIG. 6, a cleaning device 20a includes a stage 11, a liquid to be solidified supplying mechanism 16, a cooling gas supplying mechanism 17, and a melting liquid supplying mechanism 18.

Lift pins 21 is provided inside the stage 11. The template 10 is supported on a mounting surface 11a by the lift pins 21. The stage 11 is supported by a shaft 22. The lift pins 21 and the shaft 22 are connected to a driving mechanism (not illustrated). The driving mechanism causes the lift pins 21 to vertically move to the mounting surface 11a of the stage 11 in a vertical direction to rotate the shaft 22 to the mounting surface 11a in a horizontal direction. The stage 11 is stored in a cleaning cup 23. A planar shape of the cleaning cup 23 is, for example, cylindrical.

The liquid to be solidified supplying mechanism 16 includes a liquid supplying nozzle 24, a blender 25, and a concentration measurement unit 26. The liquid supplying nozzle 24 is arranged above the stage 11. The liquid supplying nozzle 24 is connected to the blender 25 through a valve 27. The liquid to be solidified supplying mechanism 16 supplies the liquid to be solidified onto the patterned surface 1a of the template 10 through the liquid supplying nozzle 24.

The deionized water (DIW) and the regulator fluid (surfactant/alcohol) are supplied to the blender 25. The regulator fluid is blended with the DIW inside the blender 25. The concentration measurement unit 26 measures the concentration of the regulator fluid in the DIW inside the blender 25. A measurement result by the concentration measurement unit 26 is transmitted to a control device 28.

The control device 28 determines whether the concentration reaches a "set value" based on the measurement result. When the concentration reaches the "set value", the control device 28 issues an instruction of "To open valve 27" to a valve control unit 29. The valve control unit 29 in which the instruction is received opens the valve 27. Therefore, the liquid to be solidified inside the blender 25 is supplied onto the patterned surface 1a of the template 10 through the liquid supplying nozzle 24.

The cooling gas supplying mechanism 17 includes a gas discharging nozzle 30. The cooling gas supplying mechanism 17 discharges a cooling gas onto the patterned surface 1a of the template 10 through the gas discharging nozzle 30. Therefore, the liquid film on the patterned surface 1a is solidified.

The melting liquid supplying mechanism 18 includes a liquid supplying nozzle 31. The melting liquid supplying mechanism 18 supplies the melting liquid onto the patterned surface 1a of the template 10 through the liquid supplying nozzle 31. Therefore, the solidified film on the patterned surface 1a is melted.

The method for cleaning a substrate according to the first embodiment can be executed by the cleaning device 20a as illustrated in FIG. 6, for example.

Third Embodiment

A third embodiment is another example of a method for cleaning a substrate.

Cleaning Method

Figure 7:
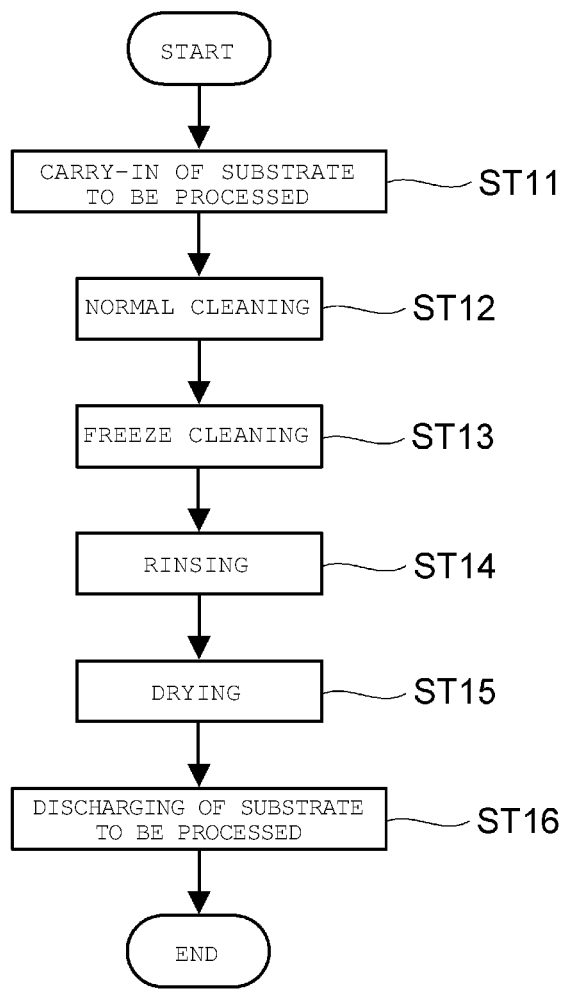
FIG. 7 is a flowchart illustrating an example of a method for cleaning a substrate according to a third embodiment.
Figure 8:
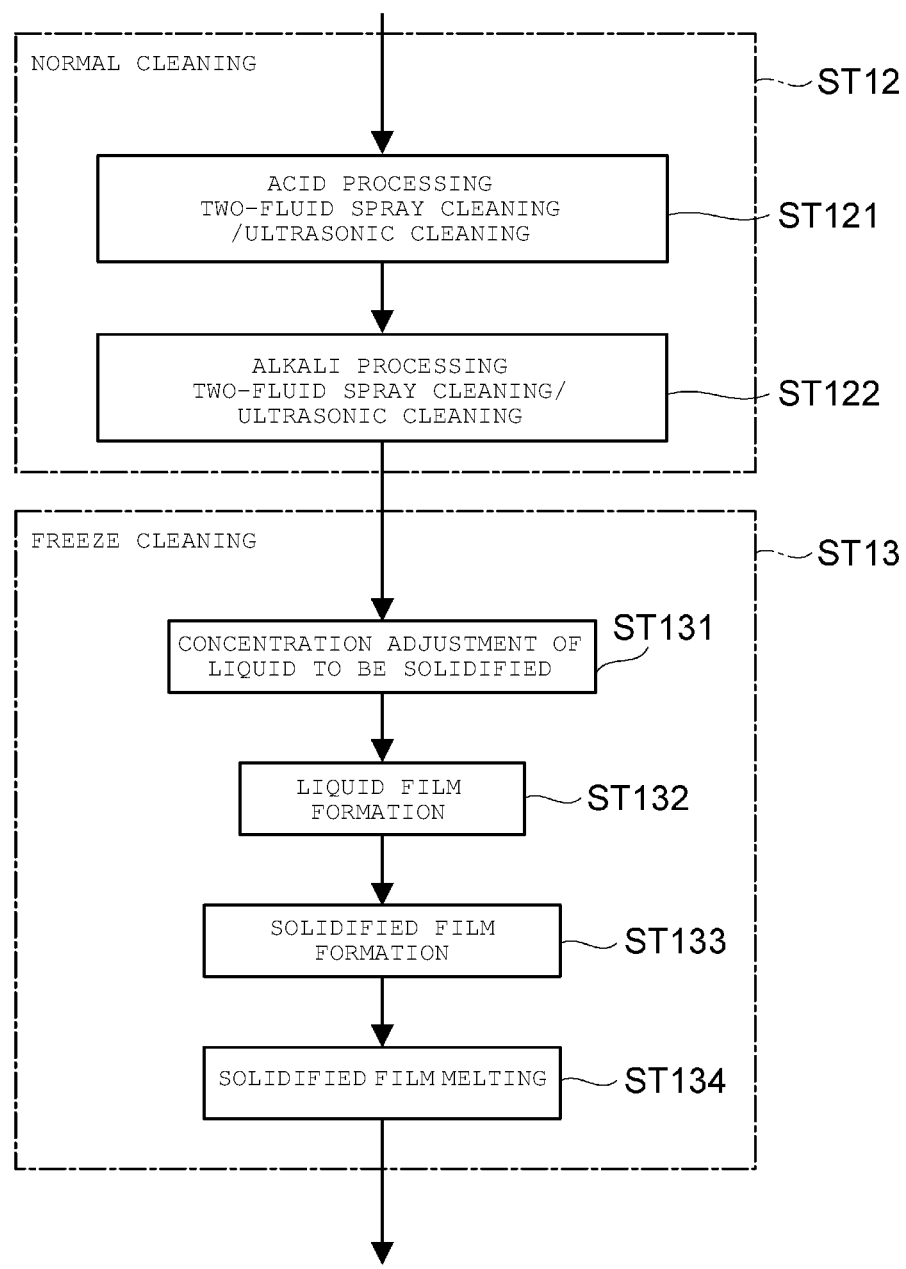
FIG. 8 is a flow chart illustrating an example of Step ST12 and Step ST13.

FIG. 7 is a flowchart illustrating an example of a method for cleaning a substrate according to the third embodiment. FIG. 8 is a flow chart illustrating an example of Step ST12 and Step ST13.

1. Processing of a Substrate

As illustrated in Step ST11 in FIG. 7, the substrate to be processed, for example, the template 10 illustrated in FIG. 2 is carried into a processing chamber of the cleaning device. Next, the template 10 is mounted on the stage.

2. Normal Cleaning of Substrate to be Processed

As illustrated in Step ST12 in FIG. 7, the template 10 is subjected to normal cleaning. For example, as illustrated in Step ST121 and Step ST122 in FIG. 8, the normal cleaning performs acid processing and alkali processing. An order of the acid processing and the alkali processing may be reversed. The normal cleaning may implement any one of the acid processing and the alkali processing.

For example, the acid processing illustrated in Step ST121 is implemented by, for example, a two-fluid spray cleaning using an acidic cleaning liquid or ultrasonic cleaning using an acidic cleaning liquid. The acid processing may implement both the two-fluid spray cleaning and the ultrasonic cleaning.

The alkali processing illustrated in Step ST122 is implemented by, for example, a two-fluid spray cleaning using alkaline cleaning liquid or ultrasonic cleaning using an acidic cleaning liquid. The alkali processing may also implement both the two-fluid spray cleaning and the ultrasonic cleaning.

Figure 9:
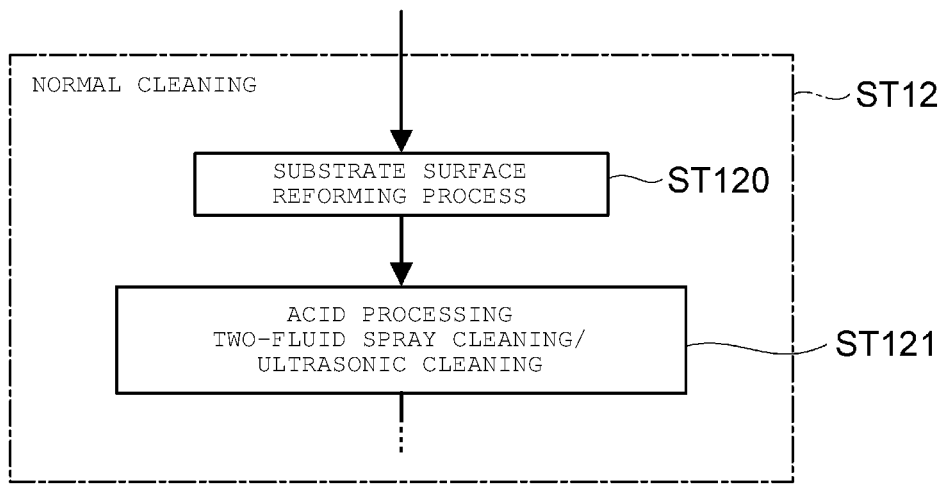
FIG. 9 is a flow chart illustrating the other example of Step ST12.
Figure 10:
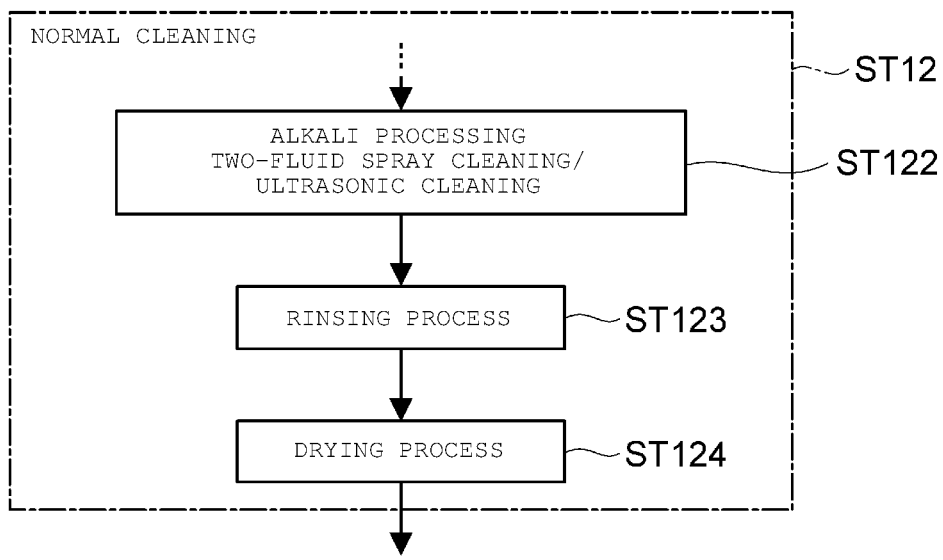
FIG. 10 is a flow chart illustrating the other example of Step ST12.
Figure 11:
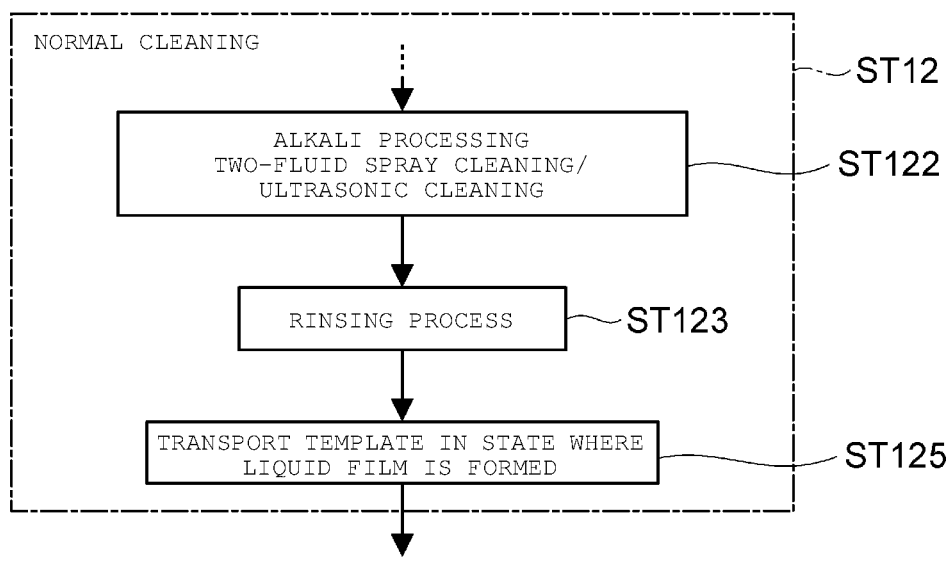
FIG. 11 is a flow chart illustrating the other example of Step ST12.

FIGS. 9 to 11 are flow charts illustrating other examples of Step ST12. For example, as illustrated in Step ST120 in FIG. 9, a substrate surface reforming process may be performed before Step ST121. An example of the substrate surface reforming process is, for example, a hydrophilization processing of the patterned surface 1a of the template 10.

In addition, for example, as illustrated in Steps ST123 and ST124 in FIG. 10, a rinsing process and a drying process may be performed after Step ST122. In the rinsing process (ST123), rinsing using a rinsing liquid is performed, for example. In the drying process (ST124), drying is performed after rinsing.

Drying after rinsing can be omitted. In a case where the drying after rinsing is omitted, for example, as illustrated in Step ST125 in FIG. 11, the template 10 is transported to the next step in a state where the liquid film is formed on the patterned surface 1a of the template 10. The liquid film is, for example, DIW. In Step ST125, the template 10 is, for example, transported in a state where the DIW is put on the patterned surface 1a of the template 10 and the liquid film is formed. The liquid film may be formed using the rinsing liquid other than the DIW, in addition to the DIW for example.

The template 10 on which the liquid film is applied is transferred where the patterned surface 1a is covered with the liquid film. Therefore, as compared with a case where the patterned surface 1a is not covered with the liquid film, advantages which can suppress the following features can be obtained in the template 10 during transporting.

1. The Particles Adhere on the Patterned Surface 1a.
2. An Organic Substance Floating in the Atmosphere Adheres on the Patterned Surface 1a.

For example, the organic substance floating in the atmosphere is one cause of occurrence of a "drying stain" on the template 10. In the template 10 in which the "drying stain" occurs in the patterned surface 1a, for example, a risk of causing pattern defects increases at the time of imprinting.

With respect to such a potential problem, in the embodiment illustrated in FIG. 11, the patterned surface 1a is covered with the liquid film during transporting. Therefore, adhesion of the organic substance floating in the atmosphere on the patterned surface 1a can be suppressed. Therefore, according to the template 10 which is manufactured by the embodiment illustrated in FIG. 11, the "drying stain" on the patterned surface 1a can be suppressed. As a result, as compared with a case where the patterned surface 1a is not covered with the liquid film during transporting, it is possible to obtain the template 10 which minimizes pattern defects at the time of imprinting.

3. Freeze Cleaning of Substrate to be Processed

After the normal cleaning, as illustrated in Step ST12 in FIG. 7, the freeze cleaning of the template 10 is performed. For example, as illustrated in Steps ST131 to ST134 in FIG. 8, in the freeze cleaning, the cleaning method described in the first embodiment is implemented. For example, Steps ST131 to ST134 correspond to Steps ST2 to ST5 in FIG. 1, respectively.

4. Rinsing of Substrate to be Processed

As illustrated in Step ST14 in FIG. 7, rinsing process of the template 10 is performed. Step ST14 corresponds to Step ST6 in FIG. 1. In addition to the DIW, an alkaline aqueous liquid may be used as the rinsing liquid. For example, when using the alkaline aqueous liquid, it is possible to suppress re-adhesion of particles on the patterned surface 1a of the template 10 as compared with the DIW.

5. Drying of Substrate to be Processed

As illustrated in Step ST15 in FIG. 7, the drying process of the template 10 is performed. Step ST15 corresponds to Step ST7 in FIG. 1. In also the third embodiment, drying of the template 10 may be implemented as needed.

6. Transporting of Substrate to be Processed

As illustrated in Step ST16 in FIG. 7, the template 10 is transported from the processing chamber of the cleaning device. Therefore, an example of the method for cleaning a substrate according to the third embodiment is ended.

Figure 12:
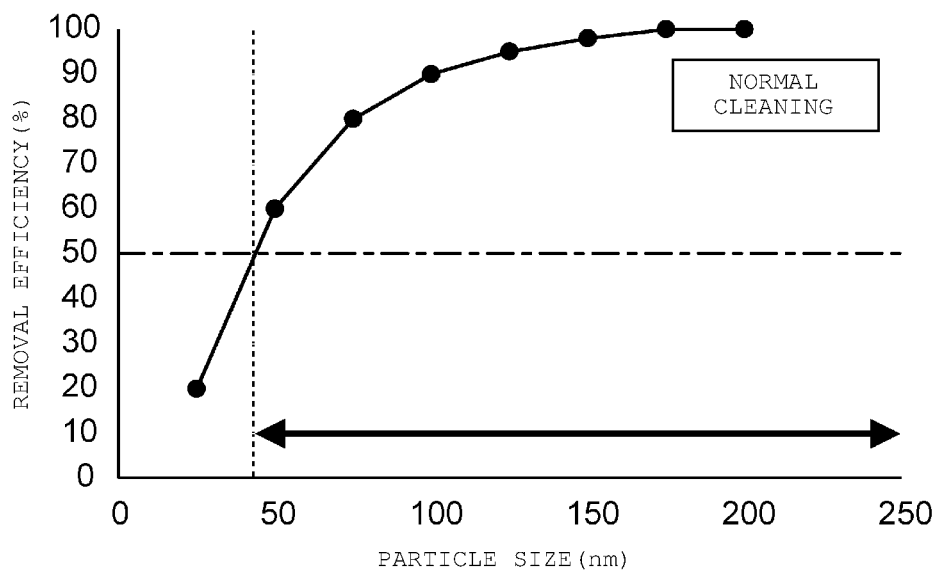
FIG. 12 is a diagram illustrating a relationship between particle size and removal efficiency.
Figure 13:
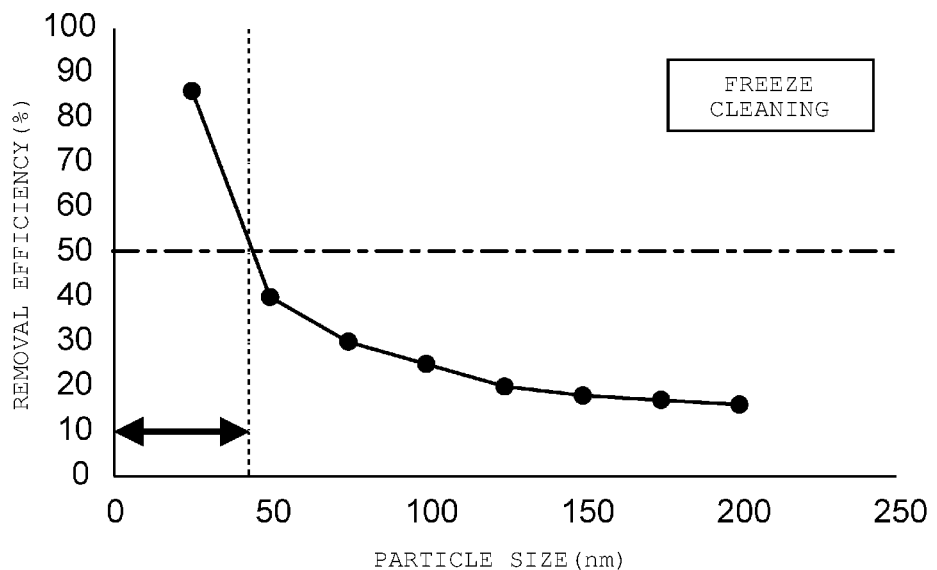
FIG. 13 is a diagram illustrating the relationship between the particle size and the removal efficiency.
Figure 14:
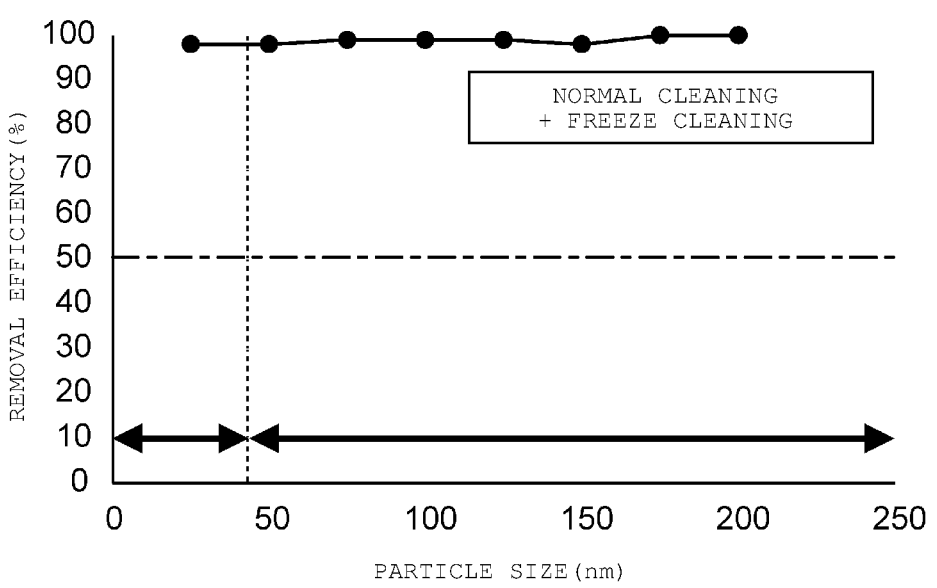
FIG. 14 is a diagram illustrating the relationship between the particle size and the removal efficiency.

FIGS. 12 to 14 are diagrams illustrating a relationship between particle size and removal efficiency.

FIG. 12 is a diagram illustrating a relationship between the particle size and the removal efficiency in normal cleaning.

As illustrated in FIG. 12, the removal efficiency of the normal cleaning ST12 indicates a tendency to decrease as the particle size decreases. In the normal cleaning ST12, when the particle size becomes smaller than approximately 40 nm, the removal efficiency is less than 50%. From the tendency illustrated in FIG. 9, in the normal cleaning ST12, when the particle size is equal to or less than about 20 nm, the removal efficiency is less than 20%. Furthermore, when the particle size is equal to or less than about 15 nm, the removal efficiency is less than 10%.

FIG. 13 is a diagram illustrating the relationship between the particle size and the removal efficiency in freeze cleaning. As illustrated in FIG. 13, the removal efficiency of the freeze cleaning ST13 indicates a tendency to increase as the particle size decreases, in contradiction to the normal cleaning ST12. In the freeze cleaning ST13, when the particle size becomes smaller than approximately 40 nm, the removal efficiency exceeds 50%. From the tendency illustrated in FIG. 10, in the freeze cleaning ST13, when the particle size is equal to or less than about 20 nm, the removal efficiency reaches about 90%. Furthermore, when the particle size is equal to or less than about 15 nm, the removal efficiency exceeds 90%.

FIG. 14 is a diagram illustrating the relationship between particle size and the removal efficiency in the third embodiment.

As illustrated in FIG. 14, in the third embodiment, the normal cleaning ST12 and the freeze cleaning ST13 are performed. Therefore, according to the third embodiment, for example, the removal efficiency of the small particles, having a size of about 15 nm or less, to particles having a size of exceeding about 15 nm, exceeds about 90%. For example, it is possible to bring the removal efficiency as close as possible to 100%. The freeze cleaning ST13 is preferably performed using the method for cleaning a substrate according to the first embodiment, for example.

In this manner, according to the third embodiment, it is possible to increase the removal efficiency of particles having a size of exceeding about 15 nm in which it is difficult to increase the removal efficiency only by the freeze cleaning ST13. Accordingly, it is possible to provide the method for cleaning a substrate which is capable of obtaining a substrate (template 10) with higher degree of cleanliness of the patterned surface 1a.

Fourth Embodiment

A fourth embodiment is an example of a production system of a substrate which can execute the method for cleaning a substrate according to the third embodiment.

Production System: First Example

FIG. 15 is a schematic block diagram illustrating a first example of a production system of the substrate.

As illustrated in FIG. 15, a production system 100a includes a processing unit 101, an operating unit 102, a storage unit 103, and a control device 104. The production system 100a is a substrate processing apparatus for implementing a process to the substrate to be processed.

The processing unit 101 cleans the template 10, for example. The processing unit 101 includes, for example, a loader 105, an unloader 106, a substrate transporting unit 107, an acid processing unit 108, an alkali processing unit 109, a freezing processing unit 110a, and an organic processing unit 111.

The loader 105 carries the template 10 before cleaning into the processing unit 101. The unloader 106 transports the template 10 after cleaning from the processing unit 101.

The substrate transporting unit 107 connects the loader 105, the unloader 106, the substrate transporting unit 107, the acid processing unit 108, the alkali processing unit 109, the freezing processing unit 110a, and the organic processing unit 111 to each other. The substrate transporting unit 107 includes a transporting path 107a therein. The transporting path 107a has a structure capable of maintaining the transporting path 107a in an airtight state with respect to air. In the present disclosure, the air indicates, for example, an atmosphere inside a cleaning room of a production factory. The atmosphere in the cleaning room is, for example, an atmosphere outside the production system 100a, for example, outside the processing unit 101. The transporting path 107a capable of maintaining the transporting path 107a in the airtight state with respect to air can increase the degree of cleanliness of the atmosphere in the transporting path 107a than the atmosphere outside the processing unit 101, for example.

The acid processing unit 108 performs an acid processing to the template 10. The acid processing is, for example, cleaning using the acidic cleaning liquid illustrated in Step ST121 in FIG. 8. The acid processing unit 108 may be provided as needed. The acid processing unit 108 can be omitted.

The alkali processing unit 109 performs an alkali processing to the template 10. The alkali processing is, for example, cleaning using the alkaline cleaning liquid illustrated in Step ST122 in FIG. 8. The alkali processing unit 109 may also be provided as needed and may be omitted.

The freezing processing unit 110a performs a freezing process to the template 10. The freezing process is, for example, freeze cleaning illustrated in Steps ST131 to ST134 in FIG. 8. The freezing processing unit 110a includes, for example, the cleaning device 20a illustrated in FIG. 6. The control device 28 illustrated in FIG. 6 may be shared with the control device 104 illustrated in FIG. 12.

The organic processing unit 111 performs an organic process to the template 10. The organic processing is, for example, IPA drying using the IPA. In addition to the IPA drying, the organic processing may be IPA cleaning using the IPA or a hydrophilization processing of the template 10 using an organic chemical liquid. The organic processing unit 111 may also be provided as needed. The organic processing unit 111 can be also omitted.

A transporting device 112 is provided on the transporting path 107a of the substrate transporting unit 107. The transporting device 112 moves in the transporting path 107a and transports the template 10 carried into the processing unit 101 in the processing unit 101. The transporting device 112 of the embodiment transports the template 10 between the loader 105, the unloader 106, the acid processing unit 108, the alkali processing unit 109, the freezing processing unit 110a, and the organic processing unit 111. The transporting device 112 transports the template 10 in the transporting path 107a without exposing the template 10 to the air.

The operating unit 102 includes, for example, a touch panel for performing an input operation or the like or a display for visualizing and displaying an operation status for managing the production system 100a by an operator. The storage unit 103 stores, for example, a control recipe or the like for advancing the cleaning process to the template 10. The control device 104 includes, for example, a microprocessor. The control device 104 reads the control recipe from the storage unit 103 based on the instruction from the operating unit 102. The control device 104 controls the processing unit 101 according to the control recipe.

The production system 100a includes the acid processing unit 108, the alkali processing unit 109, the freezing processing unit 110a, and the organic processing unit 111 as a processing unit. The production system 100a can include a dry ashing unit, an electromagnetic wave irradiation unit that radiates electromagnetic waves such as ultraviolet (UV)/vacuum ultraviolet (VUV), or the like as the other processing unit.

The dry ashing unit is used, for example, to remove the photoresist remaining on the template 10 before cleaning. The electromagnetic wave irradiation unit is used, for example, for hydrophilizing the template 10 before cleaning.

The method for cleaning a substrate according to the third embodiment can be executed by the production system 100a as illustrated in FIG. 15, for example.

Furthermore, the substrate transporting unit 107 of the production system 100a includes the transporting path 107a which can be maintained in an airtight state with respect to the air outside of the production system 100a (ambient air). The transporting path 107a can be considered as one of mini-environment, for example. The substrate transporting unit 107 connects the loader 105, the unloader 106, the substrate transporting unit 107, the acid processing unit 108, the alkali processing unit 109, the freezing processing unit 110a, and the organic processing unit 111 to each other through the transporting path 107a.

If the transporting path 107a is maintained in an airtight state with respect to the air, for example, the degree of cleanliness of the atmosphere in the transporting path 107a can be maintained in a state where the degree of cleanliness is higher than that of the atmosphere outside the processing unit 101. The transporting device 112 can transport the template 10 in the transporting path 107a with high degree of cleanliness without exposing the template 10 to the air.

For example, it is assumed that a normal cleaning device that performs normal cleaning and a freeze cleaning device that performs freeze cleaning are independently provided. In a case of such a production system, when the template 10 is transported from the normal cleaning device to the freeze cleaning device, it is required to transport the template 10 to outside the normal cleaning device once. Therefore, the template 10 is exposed to the air.

When the template 10 which is subjected to normal cleaning is exposed to the air, there is a possibility of particles re-adhering on the patterned surface 1a of the template 10 increases, from particles floating in ambient air, for example, air in the atmosphere outside the normal cleaning device.

In the freeze cleaning, as illustrated in FIG. 13, there is a tendency that the removal efficiency of the particles having a size of, for example, about 50 nm or more (hereinafter referred to as "large particles" for convenience) decreases. Therefore, even if the "large particles" are removed in normal cleaning before freeze cleaning, when the template 10 is transported from the normal cleaning device to the freeze cleaning device in a state where the template 10 is exposed to the ambient air, a possibility of re-adhering of the particles on the patterned surface 1a increases. When the "large particles" are re-adhered on the patterned surface 1a, it is difficult to obtain the template 10 with high degree of cleanliness of the patterned surface 1a, even when freeze cleaning is performed.

With respect to such a potential problem, the production system 100a illustrated in FIG. 15 can transports the template 10 from the normal cleaning device (for example, the alkali processing unit 109) to the freeze cleaning device (for example, the freezing processing unit 110a) without exposing the template 10 to the ambient air. Therefore, a possibility of re-adhering of the "large particles" on the patterned surface 1a can be reduced as compared with the production system in the template 10 is transported from the normal cleaning device to the freeze cleaning device in a state where the template 10 is exposed to the ambient air. Therefore, according to the production system 100a illustrated in FIG. 15, it is possible to produce the template 10 with higher degree of cleanliness of the patterned surface 1a.

FIG. 16 is a schematic cross-sectional view illustrating an example of a transporting state of the template 10.

As illustrated in FIG. 16, the transporting device 112 may transport the template 10 in a state where the patterned surface 1a is covered with a liquid film 19. In this case, the transporting device 112 maintains the template 10 in which the liquid film 19 is formed on the patterned surface 1a on a transporting member 120. The transporting device 112 moves the template 10 illustrated in FIG. 16 in, for example, the transporting path 107a in a state where the template 10 is maintained on the transporting member 120.

According to the transporting device 112, for example, the template 10 can be transported from the normal cleaning device (for example, the alkali processing unit 109) to the freeze cleaning device (for example, the freezing processing unit 110a) in a state where the patterned surface 1a is covered with the liquid film 19. The advantages which can suppress the following features described in the third embodiment can be obtained.

1. The Particles Adhere on the Patterned Surface 1a.
2. An Organic Substance Floating in the Atmosphere Adheres on the Patterned Surface 1a.

The transporting device 112 illustrated in FIG. 16 can be used alone. However, as the production system 100a illustrated in FIG. 15, it is preferable to use the transporting device 112 for the transporting path 107a which can be maintained in the airtight state with respect to ambient air. For example, adhesion of the particles, including the "large particles", and adhesion of the organic substance floating in the atmosphere on the patterned surface 1a can be greatly suppressed.

Production System: Second Example

Figure 17:
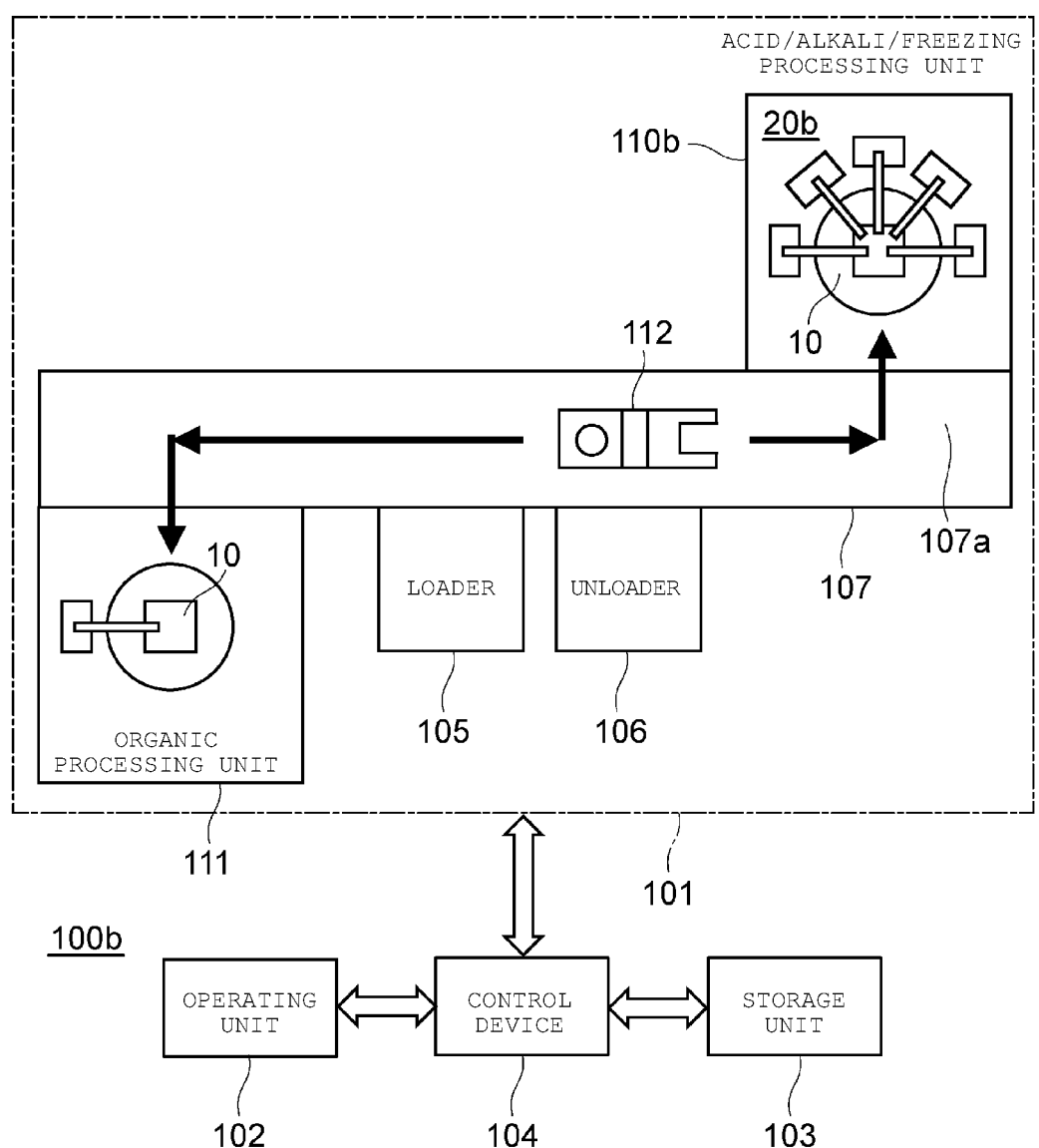
FIG. 17 is a schematic block diagram illustrating a second example of a production system of the substrate.

FIG. 17 is a schematic block diagram illustrating a second example of a production system of the substrate.

As illustrated in FIG. 17, a difference between a production system 100b and the production system 100a illustrated in FIG. 15 is that the production system 100b includes an acid/alkali/freezing processing unit 110b instead of the freezing processing unit 110a. The acid/alkali/freezing processing unit 110b performs acid processing, alkali processing, and freezing processing to the template 10. The acid process, the alkali process, and the freezing process are, for example, cleaning processes. The cleaning process includes a normal cleaning process and a freeze cleaning process.

In the production system 100b, it is possible to omit the acid processing unit 108 and the alkali processing unit 109 as compared with the production system 100a. As illustrated in FIG. 17, in the production system 100b, the acid processing unit 108 and the alkali processing unit 109 are omitted.

Figure 18:
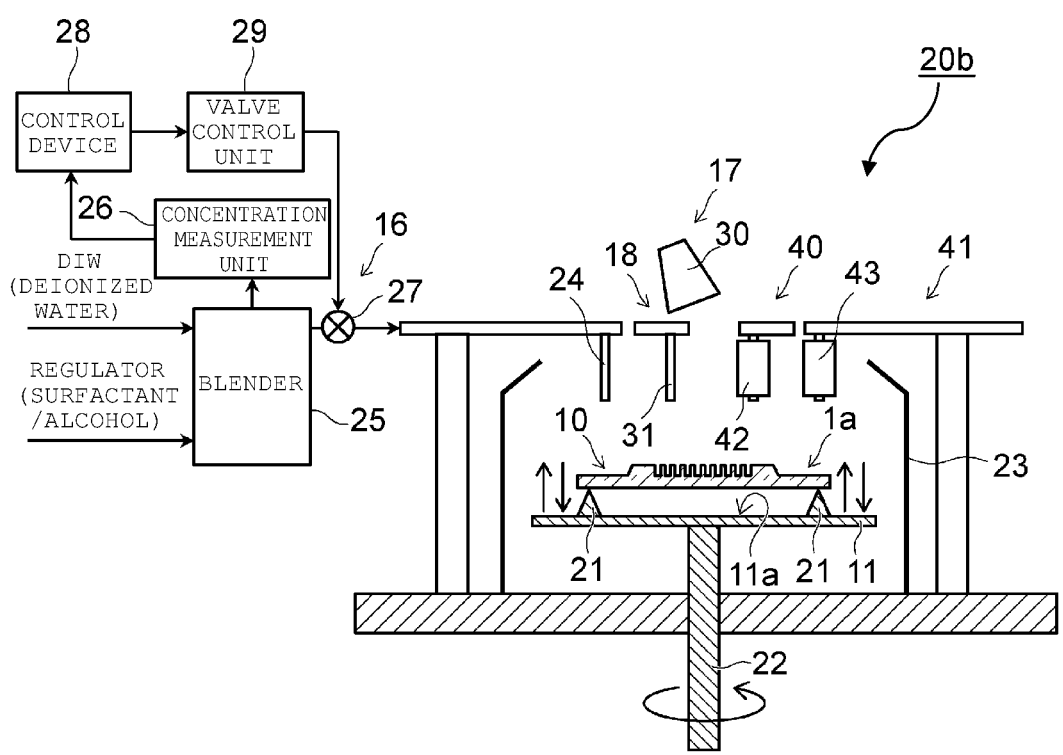
FIG. 18 is a schematic cross-sectional view schematically illustrating a cleaning device of the substrate to be used in the second example of the production system.

FIG. 18 is a schematic cross-sectional view schematically illustrating a cleaning device of the substrate to be used in the second example of the production system.

As illustrated in FIG. 18, the acid/alkali/freezing processing unit 110b includes, for example, a cleaning device 20b. A difference between the cleaning device 20b and the cleaning device 20a illustrated in FIG. 6 is that the cleaning device 20b includes an acidic cleaning liquid supplying mechanism 40 and an alkaline cleaning liquid supplying mechanism 41.

The acidic cleaning liquid supplying mechanism 40 includes a liquid supplying nozzle 42. The acidic cleaning liquid supplying mechanism 40 supplies the acidic cleaning liquid onto the patterned surface 1a of the template 10 through the liquid supplying nozzle 42. An example of the liquid supplying nozzle 42 is, for example, a two-fluid spray nozzle. The two-fluid spray nozzle discharges the acidic cleaning liquid onto the patterned surface 1a with a gas.

The alkaline cleaning liquid supplying mechanism 41 includes, for example, a liquid supplying nozzle 43. The alkaline cleaning liquid supplying mechanism 41 supplies the alkaline cleaning liquid onto the patterned surface 1a of the template 10 through the liquid supplying nozzle 43. An example of the liquid supplying nozzle 43 is also, for example, a two-fluid spray nozzle. In a case of the two-fluid spray nozzle, the two-fluid spray nozzle discharges the alkaline cleaning liquid onto the patterned surface 1a with a gas.

The cleaning device 20b as illustrated in FIG. 18 can be used for the acid/alkali/freezing processing unit 110b.

In the above-described first to fourth embodiment, for example, the following main aspects (1) to (4) are representatively exemplified.

(1) When freeze cleaning is performed, the regulator fluid that regulates the surface tension is blended with the liquid to be solidified. Therefore, the removal efficiency of the organic particles is improved as compared with a case where the regulator fluid is not blended.

(2) Before freeze cleaning, normal cleaning (for example, any one of the acid processing and the alkali processing) is performed. Therefore, for example, the removal efficiency from the small particles having a size of about 15 nm or less to the particles having a size of exceeding about 15 nm is improved as compared with a case where normal cleaning is not performed.

(3) For example, in the above (2), the template 10 is transported from the normal cleaning device (for example, the alkali processing unit 109) to the freeze cleaning device (for example, the freezing processing unit 110a) without being exposed to the ambient air. Therefore, re-adhesion of particles having a size of about 50 nm or more, for example, can be suppressed, as compared with a case where the template 10 is transported in a state where the template 10 is exposed to the ambient air. Accordingly, a cleaning effect by freeze cleaning can be more satisfactory obtained.

(4) For example, in the above (2), the template 10 is transported from the normal cleaning device (for example, the alkali processing unit 109) to the freeze cleaning device (for example, the freezing processing unit 110a) in a state where the liquid film 19 is formed on the patterned surface 1a of the template 10. Therefore, adhesion of the particles and adhesion of the organic substance floating in the atmosphere on the patterned surface 1a can be suppressed as compared with a case where transporting is performed without forming the liquid film 19. Accordingly, the cleaning effect by freeze cleaning can be more satisfactory obtained, and occurrence of a "drying stain" caused by adhesion of the organic substance on the patterned surface 1a can be suppressed.

In addition, the above aspect (1) and the above aspect (2) can also be implemented independently of each other or in combination.

In addition, the above aspect (3) and the above aspect (4) can also be implemented independently of each other or in combination.

For example, in the embodiment, terms of "normal cleaning" and "freeze cleaning" are used. In these terms, the "normal cleaning" can also be read as "main cleaning" and the "freeze cleaning" can be read as "finishing cleaning".

For example, the embodiment exemplifies cleaning of the template 10 to be used for imprint lithography, for example, nanoimprint lithography. However, the embodiment can also be applied to cleaning of the substrate in the production of a flat panel display, the production of a solar panel, and the production of a semiconductor device, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus, comprising:
a processing unit including:
    a first cleaning device that is configured to perform a first cleaning process on a substrate at a first location in the processing unit and includes at least one of an acid cleaning unit or an alkali cleaning unit, a liquid film of a first liquid being formed on the substrate in the first cleaning process;
    a second cleaning device that is configured to perform a second cleaning process on the substrate at a second location in the processing unit different from the first location, the second cleaning device including a freeze cleaning unit that applies a second liquid to the substrate, the second cleaning process including a drying process after a freeze cleaning process;
    a substrate transporting unit that connects the first location to the second location and includes a transporting path therein; and
    a transporting device that is provided in the transporting path and transports the substrate therein; and
a control device configured to control the processing unit to transport the substrate with the liquid film thereon after the first cleaning process from the first location to the second location.

2. The substrate processing apparatus according to claim 1, wherein the transporting path is sealed from ambient air.

3. The substrate processing apparatus according to claim 1, wherein the freeze cleaning unit comprises:
    a first liquid supply configured to supply a third liquid to the substrate;
    a second liquid supply configured to supply the second liquid to the substrate;
    a blender connected to the second liquid supply, the blender being connected to a water supply and a regulator liquid supply; and a concentration measurement unit configured to measure a concentration of the regulator fluid in the blender.

4. The substrate processing apparatus according to claim 3, wherein the regulator fluid comprises a surfactant.

5. The substrate processing apparatus according to claim 3, wherein the regulator fluid comprises an alcohol.

6. The substrate processing apparatus according to claim 1, wherein the first cleaning device includes an acid processing unit.

7. The substrate processing apparatus according to claim 1, wherein the first liquid and the second liquid are different liquids.

8. The substrate processing apparatus according to claim 1, further comprising:
an organic processing unit configured to receive the substrate and perform isopropyl alcohol drying on the substrate.

9. The substrate processing apparatus according to claim 1, wherein the second liquid is supplied through a first nozzle, and the second cleaning device further comprising a second nozzle to supply a third liquid onto the substrate.

10. A substrate processing apparatus, comprising:
a processing unit including:
a first cleaning device that is configured to perform a first cleaning process on a substrate at a first location in the processing unit and includes at least one of an acid cleaning unit or an alkali cleaning unit, a liquid film of a first liquid being formed on the substrate in the first cleaning process;
a second cleaning device that is configured to perform a second cleaning process on the substrate at a second location in the processing unit different from the first location, the second cleaning device comprising a first nozzle that applies a second liquid to the substrate, a gas discharging nozzle that solidifies the second liquid, and a second nozzle that applies a third liquid to the solidified second liquid, the second cleaning process including a substrate drying process;
a substrate transporting unit that connects the first location to the second location and includes a transporting path therein; and
a transporting device that is provided in the transporting path and transports the substrate therein; and
a control device configured to control the processing unit to transport the substrate with the liquid film thereon after the first cleaning process from the first location to the second location.

11. The substrate processing apparatus according to claim 10, wherein the transporting path is sealed from ambient air.

12. The substrate processing apparatus according to claim 10, wherein the first liquid and the second liquid are different liquids.

* * * * *